United States Patent
Liu et al.

(10) Patent No.: US 10,246,588 B1
(45) Date of Patent: Apr. 2, 2019

(54) SOLVENT-FREE RESIN COMPOSITION AND USES OF THE SAME

(71) Applicant: TAIWAN UNION TECHNOLOGY CORPORATION, Chupei, Hsinchu County (TW)

(72) Inventors: Shur-Fen Liu, Chupei (TW); Chin-Hsien Hung, Chupei (TW)

(73) Assignee: TAIWAN UNION TECHNOLOGY CORPORATION, Chupei (TW)

(*) Notice: Subject to any disclaimer, the term of this patent is extended or adjusted under 35 U.S.C. 154(b) by 1 day.

(21) Appl. No.: 15/819,382

(22) Filed: Nov. 21, 2017

(30) Foreign Application Priority Data

Sep. 18, 2017 (TW) .............................. 106131941 A (51) Int. Cl.
| | | |
|---|---|---|
| C08L 63/00 | (2006.01) | |
| C08L 79/04 | (2006.01) | |
| H05K 1/03 | (2006.01) | |
| H05K 1/11 | (2006.01) | |
| C08G 59/22 | (2006.01) | |
| C08G 59/32 | (2006.01) | |
| C08G 59/40 | (2006.01) | |
| C08G 59/50 | (2006.01) | |
| C08G 59/68 | (2006.01) | |

(52) U.S. Cl.
CPC .............. *C08L 79/04* (2013.01); *C08L 63/00* (2013.01); *H05K 1/0373* (2013.01); *H05K 1/115* (2013.01); *C08L 2203/206* (2013.01); *H05K 1/0346* (2013.01); *H05K 2201/012* (2013.01); *H05K 2201/0209* (2013.01); *H05K 2201/0959* (2013.01)

(58) Field of Classification Search
CPC .......... C08L 63/00; C08L 79/00; C08L 79/02; C08L 79/04; C08L 99/00; C08G 59/22; C08G 59/32; C08G 59/4014; C08G 59/5053; C08G 59/5073; C08G 59/686; B32B 15/08; B32B 15/092; B32B 27/18; B32B 27/20; B32B 27/26; B32B 27/28; B32B 27/38
USPC .............. 523/427, 428, 429, 457, 458, 466; 525/523; 428/413, 414, 416, 418
See application file for complete search history.

(56) References Cited

U.S. PATENT DOCUMENTS

| | | |
|---|---|---|
| 6,177,490 B1 | 1/2001 | Yoda et al. |
| 2002/0017399 A1 | 2/2002 | Chang et al. |
| 2004/0009335 A1 | 1/2004 | Kojima et al. |
| 2006/0240261 A1* | 10/2006 | Helen Li ............ C08G 61/12 428/411.1 |
| 2007/0191555 A1* | 8/2007 | Ishida ................. C08G 59/027 525/523 |
| 2012/0237753 A1* | 9/2012 | Setiabudi ........... C08G 73/0233 428/221 |
| 2014/0010983 A1 | 1/2014 | Gorodisher |
| 2015/0056454 A1 | 2/2015 | Takada et al. |
| 2015/0376338 A1 | 12/2015 | Fujiwara et al. |
| 2016/0362554 A1* | 12/2016 | Dyers, Jr. .............. C08L 63/00 |
| 2017/0298218 A1 | 10/2017 | Li et al. |

FOREIGN PATENT DOCUMENTS

| | | |
|---|---|---|
| CN | 103030931 A | 4/2013 |
| CN | 103459492 A | 12/2013 |
| CN | 104981513 A | 10/2015 |
| CN | 106751821 A | 5/2017 |
| CN | 106854361 A | 6/2017 |
| TW | 399398 B | 7/2000 |
| TW | 525417 B | 3/2003 |
| TW | 200402429 A | 2/2004 |
| TW | 201408478 A | 3/2014 |
| TW | 201437275 A | 10/2014 |
| TW | 201437276 A | 10/2014 |
| TW | 201720870 A | 6/2017 |
| WO | 2014153911 A1 | 10/2014 |
| WO | 201730323 A | 9/2017 |
| WO | 2018120471 A1 | 7/2018 |

OTHER PUBLICATIONS

Office Action in Taiwanese counterpart application, dated Aug. 9, 2018.

\* cited by examiner

*Primary Examiner* — Michael J Feely
(74) *Attorney, Agent, or Firm* — Michael W. Ferrell; Ferrells, PLLC; Anna L. Kinney (57) ABSTRACT

A solvent-free thermosetting filling resin composition is provided. The resin composition comprises the following components:
(A) a benzoxazine resin of formula (I),

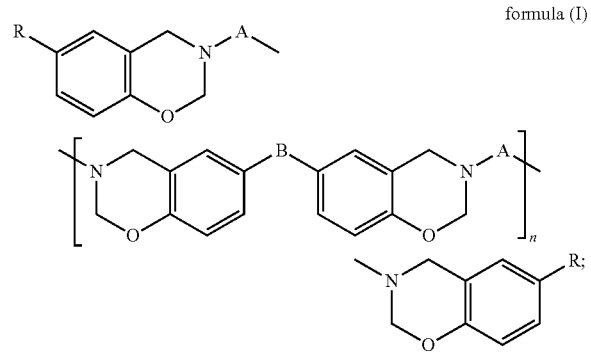

formula (I)

(B) an epoxy resin with an alicyclic skeleton;
(C) an epoxy resin hardener;
(D) a benzoxazine resin hardener; and
(E) a modified filler,
wherein, A, B, R, and n in formula (I) are as defined in the specification.

20 Claims, 2 Drawing Sheets

SOLVENT-FREE RESIN COMPOSITION AND USES OF THE SAME

CLAIM FOR PRIORITY

This application claims the benefit of Taiwan Patent Application No. 106131941 filed on Sep. 18, 2017, the subject matters of which are incorporated herein in their entirety by reference.

BACKGROUND OF THE INVENTION

Field of the Invention

The present invention provides a solvent-free resin composition, especially, a solvent-free thermosetting filling resin composition comprising a benzoxazine resin and an epoxy resin with an alicyclic skeleton. The present invention also provides a printed circuit board with holes filled by the resin composition.

Descriptions of the Related Art

Printed circuit boards (PCBs) are substrates of electronic devices for carrying multiple electronic components that are electrically connected with each other to provide a stable circuit working environment. Due to the development of high density interconnect (HDI), both the width of PCBs' wirings and the distance between the wirings are decreased while the density of the wirings are increased. Conventional PCBs are failing to keep up with the HDI circuit design. Therefore, several new types of PCBs have been developed.

In general, PCBs are formed by alternately laminating resin dielectric layers and conductive circuit layers, wherein a plurality of holes are presented between the conductive circuit layers and the holes are plated with conductive materials to form vias and thereby provide electrical connection between the conductive circuit layers. To avoid damages to the circuit in the outer layer, even out the resin dielectric layers, and make the vias serve as the basis for the stacking hole structures of upper layers, the vias must be fully filled and polished flat. A resin composition that is used to fill the vias must have desired mechanical properties, electrical properties, and physicochemical properties.

TW 399398 discloses a filling composition, which comprises an epoxy resin in the form of a liquid at room temperature, a phenolic resin in the form of a liquid at room temperature, a hardening catalyst, and an inorganic filler. The composition shrinks only sparingly during the course of thermal curing and shows low hygroscopicity after the thermal curing. TW 200402429 discloses a solvent-free filling material, which comprises a filler, a thermosetting resin, dicyandiamide hardener, and a hardening catalyst. The filling material provides better adhesion to the conductive layer provided thereon, thereby preventing delamination or cracking of the conductive layer, the insulating layer, the solder resist layer, and the like. TW 201437276 discloses a filling epoxy resin composition, which comprises an epoxy resin, imidazole compound, borate ester compound, and an inorganic filler. The epoxy composition has good storage stability and thermal resistance and reduces the occurrence of voids and cracks during polishing. CN 103030931 discloses a thermosetting resin filling material, which comprises an epoxy resin, an epoxy hardener and an inorganic filler, wherein the epoxy hardener is selected from the group consisting of modified aliphatic polyamines and modified alicyclic polyamines. The thermosetting resin filling material has a long-term storage stability under room temperature and good filling operation performance.

Recently, with trends of high-frequency and high-speed transmission and miniaturization of electronic products, dielectric materials with low dielectric constant (Dk) and low dissipation factor (Df) have received attentions in their applications for PCBs. Therefore, there is an urgent need for a thermosetting filling resin composition with a low Dk.

SUMMARY OF THE INVENTION

In view of the aforementioned technical problems, the present invention provides a solvent-free thermosetting filling resin composition, which can be used to fill the holes in PCBs. The resin composition of the present invention has excellent printability (ability of filling) and can fill the holes without generating any flaws such as bubbles, cracking or gaps. Furthermore, the dielectric material obtained by curing the resin composition has a low dielectric constant (Dk), low dissipation factor (Df), and excellent thermal resistance.

As illustrated in the following objectives, the technical means of the present invention for resolving the problems lies in using a benzoxazine resin with a specific structure, an epoxy resin with an alicyclic skeleton, an epoxy resin hardener, a benzoxazine resin hardener, and a modified filler in combination. By means of the technical means, the resin composition of the present invention and the dielectric material obtained by curing the resin composition are provided with the aforementioned advantages, thereby, meeting the demands of high-frequency and high-speed micro-electronic products.

An objective of the present invention is to provide a solvent-free resin composition, which comprises the following:

(A) a benzoxazine resin of formula (I), formula (I)

(B) an epoxy resin with an alicyclic skeleton;
(C) an epoxy resin hardener;
(D) a benzoxazine resin hardener; and
(E) a modified filler,
wherein in formula (I),
A is a $C_{24}$-$C_{48}$ divalent hydrocarbon group with one or more aliphatic side chains;
B is a covalent bond, or a $C_1$-$C_{13}$ divalent hydrocarbon group;
R is H or a $C_1$-$C_{15}$ alkyl; and
n is an integer of 0 to 100.

In some embodiments of the present invention, n is an integer of 0 to 50.

In some embodiments of the present invention, the epoxy resin (B) with an alicyclic skeleton does not contain a glycidyl ether group and has an ester group or an ether group as a connecting group.

In some embodiments of the present invention, the epoxy resin hardener (C) is selected from the group consisting of imidazole, imidazole derivatives, salts of imidazole, salts of imidazole derivatives, and combinations thereof.

In some embodiments of the present invention, the benzoxazine resin hardener (D) is selected from the group consisting of thiodipropionic acid, phenols, thiodiphenol benzoxazine, sulfonyl benzoxazine, sulfonyldiphenol, and combinations thereof.

In some embodiments of the present invention, the modified filler (E) is selected from the group consisting of modified silica, modified barium sulfate, modified calcium carbonate, modified silicon nitride, modified aluminum nitride, modified boron nitride, modified aluminum oxide, modified magnesium oxide, modified aluminum hydroxide, modified magnesium hydroxide, modified titanium oxide, modified mica, modified talc, modified organic bentonite, modified kaolin, modified Sillitin, modified silicon, and combinations thereof. In the appended Examples, the modified filler (E) is modified silica.

In some embodiments of the present invention, the weight ratio of the benzoxazine resin (A) to the epoxy resin (B) with an alicyclic skeleton is about 1:9 to about 9:1, and preferably about 3:7 to about 7:3.

In some embodiments of the present invention, the amount of the epoxy resin hardener (C) is about 0.1 parts by weight to about 20 parts by weight per 100 parts by weight of the epoxy resin (B) with an alicyclic skeleton.

In some embodiments of the present invention, the amount of the benzoxazine resin hardener (D) is about 0.1 parts by weight to about 20 parts by weight per 100 parts by weight of the benzoxazine resin (A).

In some embodiments of the present invention, the amount of the modified filler (E) is about 35 wt % to about 80 wt % based on the total weight of the resin composition.

In some embodiments of the present invention, the resin composition further comprises an additive selected from the group consisting of flame retardants, colorants, viscosity modifiers, thixotropic agents, defoaming agents, leveling agents, coupling agents, mold-release agents, surface treating agents, plasticizers, antibacterial agents, antimould agents, stabilizers, antioxidants, phosphors, and combinations thereof. Examples of flame retardants includes phosphorous-containing flame retardants, bromine-containing flame retardants, and combinations thereof.

Another objective of the present invention is to provide a printed circuit board, which has holes filled by using the aforementioned resin composition.

To render the above objectives, technical features and advantages of the present invention more apparent, the present invention will be described in detail with reference to some embodiments hereinafter.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion.

Unless it is additionally explained, the expressions "a," "the," or the like recited in the specification (especially in the appended claims) should include both the singular and the plural forms.

Unless it is additionally explained, while describing the constituents in the solution, mixture and composition in the specification, the amount of each constituent is calculated based on the dry weight, i.e., regardless of the weight of the solvent.

The resin composition of the present invention is a solvent-free formulation which includes a benzoxazine resin with a specific structure, an epoxy resin with an alicyclic skeleton, a hardener, and a modified filler. The resin composition has good printability, and can provide a dielectric material with outstanding electrical properties and thermal resistance. The technical features and effects related to the present invention are described below based on some embodiments.

Resin Composition

The resin composition of the present invention is a solvent-free thermosetting filling resin composition. The term "thermosetting filling resin composition" refers to a resin composition that can be used to fill holes (e.g., vias) in a printed circuit board and cured by heat to form a dielectric material. In addition, the term "solvent-free" means that the amount of the solvent, based on the total weight of the resin composition, is not more than 5 wt %, preferably not more than 3 wt %, and more preferably not more than 1 wt %. In general, the solvent constituent of a resin composition will evaporate due to heat during the thermal curing of the resin composition. However, if a resin composition containing a solvent is applied to fill holes in a printed circuit board that have a higher aspect ratio, the solvent will not be able to evaporate completely during the thermal curing and thus, a portion of the solvent will remain in the filled holes after the thermal curing is done. As a result, during the manufacturing of the printed circuit board, the remaining portion of the solvent will expand because of heat and thus forms bubbles or cracks in the filled holes. The bubbles or cracks will cause delamination and cracking of the printed circuit board and thus, lower the yield. The solvent-free resin composition of the present invention can effectively decrease or avoid the formation of bubbles and cracks in the filled holes, thereby decreasing or avoiding delamination and cracking of the printed circuit board to achieve a higher yield.

Specifically, the resin composition of the present invention comprises (A) a benzoxazine resin with a specific structure, (B) an epoxy resin with an alicyclic skeleton, (C) an epoxy resin hardener, (D) a benzoxazine resin hardener, and (E) a modified filler. The detailed descriptions for each constituents of the resin composition are provided below.

(A) Benzoxazine Resin

In the resin composition of the present invention, the benzoxazine resin has a structure of the following formula (I).

formula (I)

In formula (I), A is a $C_{24}$-$C_{48}$ divalent hydrocarbon group with one or more aliphatic side chains, wherein the divalent hydrocarbon group may be a chain hydrocarbon group or cyclic hydrocarbon group and is preferably a chain hydrocarbon group. B is a covalent bond, or a $C_1$-$C_{13}$ divalent hydrocarbon group. Examples of the $C_1$-$C_{13}$ divalent hydrocarbon group include but are not limited to methylene, ethylene, and propylene. R is H or a $C_1$-$C_{15}$ alkyl, and examples of the $C_1$-$C_{15}$ alkyl include but are not limited to methyl, ethyl, propyl, butyl, and pentyl. Furthermore, n is an integer of 0 to 100 and preferably an integer of 0 to 50.

The benzoxazine resin of formula (I) is commercially available. Examples of the commercially available benzoxazine resin of formula (I) include products with trade names N6052 and N60 available from CHIN YEE CHEMICAL. Alternatively, the benzoxazine resin of formula (I) may be synthesized by using phenols, aldehydes and diamines. For example, the benzoxazine resin of formula (I) may be synthesized by mixing diphenols, monophenols, aldehydes, diamines in a solvent to provide a mixture, heating the mixture to a temperature of about 80° C. to about 120° C. to carry out the reaction, and removing the solvent after the reaction is finished.

Examples of diphenols suitable for synthesizing the benzoxazine resin of formula (I) include but are not limited to biphenol, bisphenol M, bisphenol A, bisphenol Z, bisphenol P, fluorine-9-bisphenol, bisphenol E, bisphenol B, bisphenol F, and 4-hydroxyphenyl-4-hydroxybenzoate.

Examples of monophenols suitable for synthesizing the benzoxazine resin of formula (I) include but are not limited to phenol, p-phenylphenol, methylphenol, ethylphenol, cardanol, isopropylphenol, t-butylphenol, terpene phenol, pentylphenol, hexylphenol, heptylphenol, octylphenol, nonylphenol, decylphenol, and dodecylphenol.

Examples of aldehydes suitable for synthesizing the benzoxazine resin of formula (I) include but are not limited to formaldehyde, acetaldehyde, metaformaldehyde, paraldehyde, and paraformaldehyde.

Examples of diamines suitable for synthesizing the benzoxazine resin of formula (I) include but are not limited to di(aminocyclohexyl)methane, 4,4'-methylene bis(2,6-dimethyl cyclohexylamine), 4,4'-methylene bis(2,6-diethyl cyclohexylamine), 4,4'-methylene bis(2,6-diisopropyl cyclohexylamine), 4,4'-methylene bis(2,6-dibutyl cyclohexylamine), 4,4'-methylene bis(2,6-dipentyl cyclohexylamine), 4,4'-methylene bis(2,6-dihexyl cyclohexylamine), 4,4'-methylene bis(2-methyl-6-ethyl cyclohexylamine), 4,4'-methylene bis(2-methyl-6-isopropyl cyclohexylamine), 4,4'-methylene bis(2-methyl-6-butyl cyclohexylamine), and $C_{32}$-$C_{48}$ dimer amines. $C_{32}$-$C_{48}$ dimer amines includes $C_{44}$ dimer amines, $C_{40}$ dimer amines, $C_{36}$ dimer amines, and $C_{32}$ dimer amines. Examples of $C_{32}$-$C_{48}$ dimer amines include but are not limited to -continued Examples of solvents suitable for synthesizing the benzoxazine resin of formula (I) include but are not limited to 1-butanol, 2-butanol, cyclohexane, isobutanol, methyl isobutyl ketone, diisobutyl ketone, methyl isopentyl ketone, cyclopentanone, cyclohexanone, tetrahydrofuran, benzene, toluene, xylene, mesitylene, 1,2,4-trimethylbenzene, dioxane, β-butyrolactone, β-valerolactone, β-caprolactone, γ-butyrolactone, γ-valerolactone, γ-caprolactone, 3-methyloctanoyl-4-lactone, 4-hydroxy-3-pentenoic acid γ-lactone, chloroform, dichloromethane, diethylene glycol monoethyl ether, diethylene glycol monobutyl ether acetate, propylene glycol monomethyl ether, propylene glycol monoethyl ether, propylene glycol monopropyl ether, n-butyl acetate, methoxyethanol, and ethoxyethanol. The aforementioned solvents can be used either alone or in combination.

In the resin composition of the present invention, based on the total weight of the resin composition, the amount of the benzoxazine resin (A) of formula (I) may be about 2 wt % to about 70 wt %, preferably about 5 wt % to about 60 wt %, and more preferably about 10 wt % to about 50 wt %, such as 10.5 wt %, 11 wt %, 11.5 wt %, 12 wt %, 13 wt %, 13.5 wt %, 14 wt %, 15 wt %, 16 wt %, 16.5 wt %, 17 wt %, 18 wt %, 20 wt %, 22 wt %, 23 wt %, 25 wt %, 27 wt %, 28 wt %, 30 wt %, 32 wt %, 35 wt %, 35.5 wt %, 37 wt %, 40 wt %, 42 wt %, 45 wt %, 47 wt %, or 50 wt %.

(B) Epoxy Resin with an Alicyclic Skeleton

An alicyclic epoxy resin with an alicyclic skeleton is used in the resin composition of the present invention. The alicyclic epoxy resin is a thermosetting resin that has an alicyclic skeleton and at least two epoxy groups per molecule. The epoxy resin with an alicyclic skeleton preferably does not have a glycidyl ether group, and preferably has an epoxy group in which two carbon atoms are simultaneously two of the carbon atoms that compose the alicyclic skeleton or an epoxy group directly bonded with the alicyclic skeleton.

The aforementioned epoxy resin with an alicyclic skeleton has a connecting group in the molecular structure. Examples of the connecting group include but are not limited to a single bond, an alkylene group, carbonyl (—CO—), an ether group (—O—), an ester group (—COO—), an amido group (—CONH—), a carbonate group (—OCOO—), and a group formed by connecting at least two of the aforementioned groups. The alkylene group is preferably a $C_1$-$C_{18}$ alkylene group. Examples of the alkylene group include but are not limited to linear alkylene groups, such as methylene, methymethylene, dimethylmethylene, ethylene, propylene, and trimethylene, branched alkylene groups, and divalent cyclic alkylene groups, such as 1,2-cyclopentylene, 1,3-cyclopentylene, cyclopentylidene, 1,2-cyclohexylene, 1,3-cyclohexylene, 1,4-cyclohexylene, and cyclohexylidene. Divalent cyclic alkylene groups are preferred alkylene groups. In the resin composition of the present invention, it is preferable that the epoxy resin with an alicylclic skeleton has an ether group (—O—) or an ester group (—COO—) as a connecting group.

The epoxy resin with an alicyclic skeleton is commercially available. Examples of the commercially available epoxy resin with an alicyclic skeleton include the products with trade names CELLOXIDE 2021P and CELLOXIDE 2081 available from DAICEL CHEMICAL INDUSTRIES or the product with trade name EHPE 3150 available from DAICEL CHEMICAL INDUSTRIES. The products with trade names CELLOXIDE 2021P and CELLOXIDE 2081 are epoxy resins with an ether group (—O—) as a connecting group. The product with trade name EHPE is an epoxy resin with an ester group (—COO—) as a connecting group. Alternatively, the epoxy resin with an alicyclic skeleton may be prepared by oxidizing an alicyclic olefin compound with a corresponding aliphatic percarboxylic acid. From the viewpoint of the epoxidation degree, an anhydrous aliphatic percarboxylic acid is preferred in the aforementioned preparation. The specific preparation of the epoxy resin with an alicyclic skeleton will not be described in detail herein because it is not a critical point of the present invention and can be performed by persons with ordinary skill in the art based on their ordinary skill after reading the disclosure of the subject specification.

In the resin composition of the present invention, based on the total weight of the resin composition, the amount of the epoxy resin with an alicyclic skeleton may be about 2 wt % to about 70 wt %, preferably about 10 wt % to about 60 wt %, and more preferably about 15 wt % to about 50 wt %, such as 15.5 wt %, 16 wt %, 17 wt %, 17.5 wt %, 18 wt %, 19 wt %, 20 wt %, 21 wt %, 22 wt %, 22.5 wt %, 23 wt %, 24 wt %, 25 wt %, 26 wt %, 27 wt %, 27.5 wt %, 28 wt %, 30 wt %, 31 wt %, 32 wt %, 32.5 wt %, 33 wt %, 33.5 wt %, 34 wt %, 35 wt %, 36 wt %, 38 wt %, 40 wt %, 42 wt %, 43 wt %, 45 wt %, 46 wt %, 47 wt %, 48 wt %, or 49 wt %.

In the resin composition of the present invention, the weight ratio of the benzoxazine resin (A) of formula (I) to the epoxy resin (B) with an alicyclic skeleton is preferably about 1:9 to about 9:1, more preferably about 1:4 to about 4:1, and most preferably about 3:7 to about 7:3, such as 1:2, 1:1, or 2:1. It has been found that when the benzoxazine resin of formula (I) and the epoxy resin with an alicyclic skeleton are used in the aforementioned preferred ratio, the resin composition has better printability, and the dielectric material prepared therefrom has better thermal resistance.

(C) Epoxy Resin Hardener

The epoxy resin hardener refers to a hardener suitable for promoting the curing of the epoxy resin. The species of the epoxy resin hardener is not particularly limited and can be any conventional hardener that is generally used in combination with an epoxy resin with an alicyclic skeleton. Examples of the epoxy resin hardener include but are not limited to imidazole, imidazole derivatives, salts of imidazole, salts of imidazole derivatives, amines, organic phosphine compounds, amidines, and anhydrides. The aforementioned epoxy resin hardeners can be used either alone or in combination.

Examples of imidazole or imidazole derivatives include but are not limited to 2-ethyl-4-methylimidazole and azine derivatives thereof, 2-undecylimidazole, 2-heptadecylimidazole, 2-phenylimidazole, azine derivatives of 2-methylimidazole, 2-phenyl-4,5-dihydroxy methyl imidazole, and 2-phenyl-4-methyl-5-hydroxy methyl imidazole. Examples of salts of imidazole or imidazole derivatives include but are not limited to isocyanurates of 2-phenylimidazole and isocyanurates of azine derivatives of 2-methylimidazole.

Examples of amines include but are not limited to dicyanodiamide and derivatives thereof, melamine and derivatives thereof, diaminomaleonitrile and derivatives thereof, diethylene triamine, triethylene tetramine, tetraethylene pentamine, bis(hexamethylene) triamine, triethylene glycol amine, diamino diphenyl methane, organic acid dihydrazide, and 3,9-bis(3-aminopropyl)-2,4,8,10-tetraoxaspiro[5.5]undecane. The product with trade name DBU available from SAN-APRO Company is an example of amine-based epoxy resin hardener.

Examples of organic phosphine compounds include but are limited to triphenylphosphine, tricyclohexylphosphine, tributylphosphine, and methyl diphenyl phosphine.

One example of amidines is 1,8-diazabicyclo[5.4.0]undec-7-ene, but amidines are not limited thereto. The product with trade name ATU available from AJINOMOTO Company is an amidine-based epoxy resin hardener.

Examples of anhydrides include but are not limited to tetrapropenyl succinic anhydride, methyl tetrahydro phthalic anhydride, methyl hexahydro phthalic anhydride, dodecenyl succinic anhydride, and methyl endo-methylene tetrahydro phthalic anhydride.

In addition, dicyanodiamide, melamine, acetoguanamine, benzoguanamine, 3,9-bis[2-(3,5-diamino-2,4,6-traizine)ethyl]-2,4,8,10-tetraoxaspiro[5.5]undecane, derivatives thereof, organic acid salt thereof, and epoxy adducts thereof not only can be used as an epoxy resin hardener, but also contribute to prevent copper in the printed circuit board from discoloration due to their copper fitting and anti-rusting properties.

In the aforementioned epoxy resin hardeners, imidazole, imidazole derivatives, salts of imidazole, salts of imidazole derivatives, and combinations thereof, such as the products with trade names 2E4MZ, C11Z, C17Z, 2PZ, 2MZ-A, 2E4MZ-A, 2MA-OK, 2PZ-OK, 2PHZ, and 2P4MHZ available from SHIKOKU CHEMICALS, are preferred. The reason lies in that imidazoles have excellent thermal resistance and chemical resistance, and their hydrophobicity could lower moisture absorption.

In the resin composition of the present invention, based on 100 parts by weight of the epoxy resin (B) with an alicyclic skeleton, the amount of the epoxy resin hardener (C) is about 0.1 parts by weight to about 20 parts by weight, preferably about 1 part by weight to about 10 parts by weight, more preferably about 2 parts by weight to about 8 parts by weight, such as 3 parts by weight, 4 parts by weight, 5 parts by weight, 5.5 parts by weight, 6 parts by weight, 6.25 parts by weight, 6.5 parts by weight, 7 parts by weight, or 7.5 parts by weight. Without being restricted by any theories, it is believed that when the amount of the epoxy resin hardener is within the aforementioned preferred ranges, the epoxy resin hardener can effectively promote the curing of the epoxy resin without affecting the characteristics of other constituents of the resin composition.

(D) Benzoxazine Resin Hardener

The benzoxazine resin hardener refers to a hardener suitable for promoting the curing of the benzoxazine resin of formula (I). The species of the benzoxazine resin hardener is not particularly limited and can be any conventional hardener that is generally used in combination with a benzoxazine resin. Examples of the benzoxazine resin hardener include but are not limited to thiodipropionic acid, phenols, thiodiphenol benzoxazine, and sulfonyl benzoxazine, sulfonyldiphenol. The aforementioned benzoxazine resin hardeners can be used either alone or in combination. In the appended Examples, thiodipropionic acid is used.

In the resin composition of the present invention, based on 100 parts by weight of the benzoxazine resin (A), the amount of the benzoxazine resin hardener (D) is about 0.1 parts by weight to about 20 parts by weight, preferably about 2 parts by weight to about 15 parts by weight, more preferably about 4 parts by weight to about 12 parts by weight, such as 4.5 parts by weight, 5 parts by weight, 6 parts by weight, 7.5 parts by weight, 8 parts by weight, 10 parts by weight, or 11 parts by weight. Without being restricted by any theories, it is believed that when the amount of the benzoxazine resin hardener is within the aforementioned preferred ranges, the benzoxazine resin hardener can effectively promote the curing of the benzoxazine resin without affecting the characteristics of other constituents of the resin composition.

(E) Modified Filler

As used herein, the modified filler refers to a surface-modified filler, including surface-modified organic fillers, surface-modified inorganic fillers, and surface-modified metallic fillers. In some embodiments of the present invention, the modified filler is an inorganic filler modified with a silane coupling agent. Examples of the silane coupling agent include but are not limited to vinyl silane, styryl silane, methyl acryloyl silane, acryloyl silane, epoxy silane, amino silane, thiol silane, isocyanate silane, alkyl silane, and isocyanurate silane. Epoxy silane or amino silane are preferred silane coupling agents in terms of the affinity between the silane coupling agent and the epoxy resin and the hardenability and electrical properties of the resin composition after curing.

Examples of the modified filler include but are not limited to modified silica, modified barium sulfate, modified calcium carbonate, modified silicon nitride, modified aluminum nitride, modified boron nitride, modified aluminum oxide, modified magnesium oxide, modified aluminum hydroxide, modified magnesium hydroxide, modified titanium oxide, modified mica, modified talc (including sintered talc), modified organic bentonite, modified kaolin (including sintered kaolin), modified Sillitin, and modified silicon. The aforementioned modified fillers can be used either alone or in combination. In some embodiments of the present invention, modified silica is used. Examples of modified silica include but are not limited to modified spherical silica, modified flake-shaped silica, modified columnar silica, modified hollow-tubular silica, and modified hollow-microspherical silica, and modified spherical silica is preferred.

In the resin composition of the present invention, based on the total weight of the resin composition, the amount of the modified filler (E) is about 35 wt % to about 80 wt %, preferably about 38 wt % to about 70 wt %, more preferably about 40 wt % to about 65 wt %, such as 41 wt %, 42 wt %, 43 wt %, 45 wt %, 45.5 wt %, 46 wt %, 46.5 wt %, 47 wt %, 48 wt %, 48.5 wt %, 50 wt %, 52 wt %, 55 wt %, 55.5 wt %, 57 wt %, 60 wt %, 62 wt %, 63 wt %, or 64.5 wt %.

(F) Other Optional Constituents

The resin composition of the present invention may optionally further comprise other constituents such as the additives well-known to persons with ordinary skill in the art in order to improve the physicochemical properties of the dielectric material obtained by curing the resin composition or the processability of the resin composition during the manufacturing process of the dielectric material. Examples of the additives include but are not limited to flame retardants, colorants, viscosity modifiers, thixotropic agents, defoaming agents, leveling agents, coupling agents, mold-release agents, surface treating agents, plasticizers, antibacterial agents, antimould agents, stabilizers, antioxidants, phosphors, and combinations thereof. The aforementioned additives can be used either alone or in combination.

Examples of defoaming agents include but are not limited to polysiloxane-based compounds (e.g., polydimethylsiloxane), modified polysiloxane-based compounds, fluorine-containing compounds, polymer-based compounds, and surfactants.

Examples of flame retardants include but are not limited to phosphorous-containing flame retardants, bromine-containing flame retardants, and combinations thereof. Examples of phosphorous-containing flame retardants include but are not limited to phosphates, phosphazenes, poly ammonium phosphates, and melamine polyphosphates. Examples of bromine-containing flame retardants include but are not limited to tetrabromobisphenol A, decabromodiphenyloxide, decabrominated diphenyl ethane, 1,2-bis(tribromophenyl)ethane, brominated epoxy oligomers, octabromotrimethylphenyl indane, bis(2,3-dibromopropyl ether), tris(tribromophenyl)triazine, brominated aliphatic hydrocarbon, and brominated aromatic hydrocarbon.

Colorants can be any general inks with resistance to printing. Examples of colorants include but are not limited to phthalocyanine blue, phthalocyanine green, iodine green, bis-azo yellow, crystal violet, titanium oxide, carbon black or naphthalene black.

Printed Circuit Boards

The resin composition of the present invention can be used to fill holes (e.g., vias) in printed circuit boards. Thus, the present invention also provides a filled printed circuit board, which has holes filled by using the resin composition of the present invention. In general, holes in a printed circuit board can be classified as through holes and non-through holes according to whether the holes pass through the printed circuit board or not. Examples of through holes include but are not limited to plating through holes (PTHs) and non-plating through holes (NPTHs). Examples of non-through holes include but are not limited to buried vias, blind vias, and pits between conductive circuits. The method of forming the filled printed circuit board is described below with reference to the appended figures.

Figure 1A:
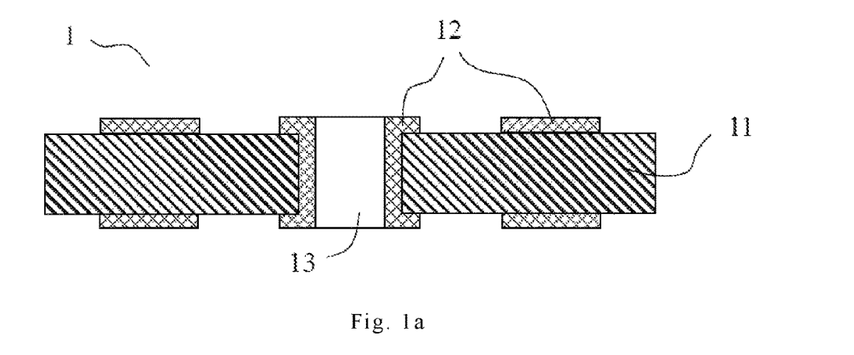
FIGS. 1a to 1c are schematic diagrams showing an embodiment of the filled printed circuit board of the present invention.
Figure 1B:
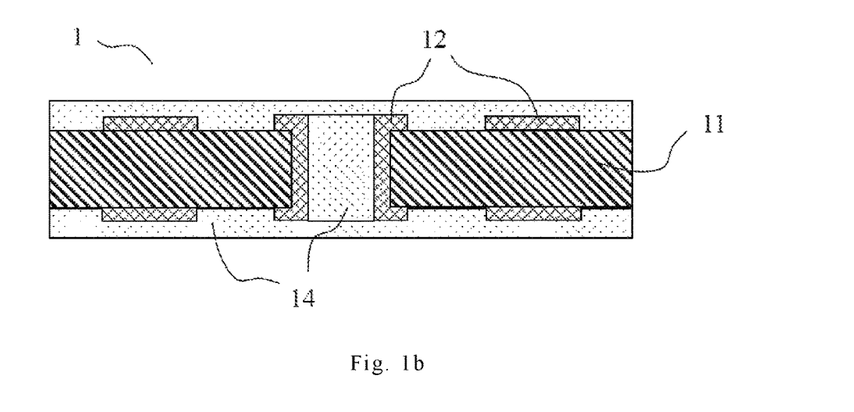
Figure 1C:
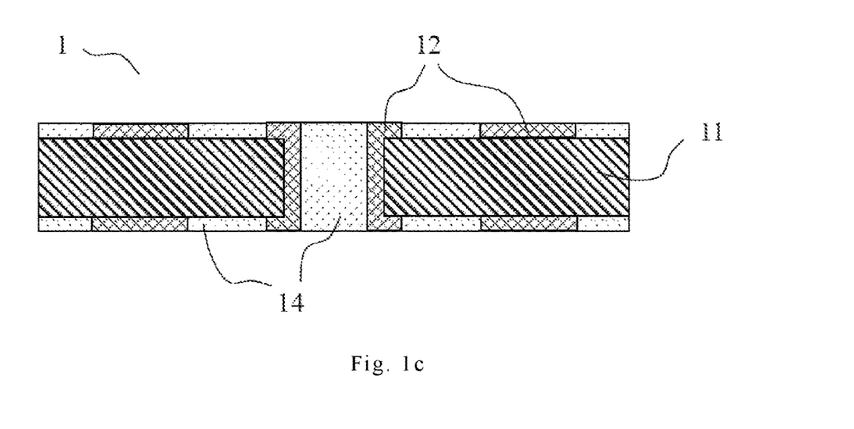

FIGS. 1a to 1c are schematic diagrams showing an embodiment of the filled printed circuit board of the present invention. As shown in FIG. 1a, the printed circuit board 1 has a dielectric layer 11, a conductive circuit layer 12, and holes 13. As shown in FIG. 1b, the resin composition 14 of the present invention can be filled into the holes 13 of the printed circuit board 1 using any conventional patterning methods, and then the filled resin composition 14 is heated to a predetermined temperature for curing. Examples of conventional patterning methods include but are not limited to a screen printing method, a roller coating method, a mold coating method, and a spray coating method. Finally, as shown in FIG. 1c, a cured part of the resin composition 14 that protrudes from the printed circuit board 1 is removed by grinding or polishing, thereby making the surface of the printed circuit board 1 flat to obtain the filled printed circuit board.

For ease of grinding or polishing, the aforementioned heating and curing of the resin composition may be performed in two stages. For example, the resin composition can be heated under about 90° C. to about 150° C. for about 30 to about 90 minutes to reach a semi-cured state. Then, the semi-cured part of the resin composition that protrudes from the printed circuit board is removed by grinding or polishing. Finally, the semi-cured resin composition is heated under about 140° C. to about 250° C. for about 30 to about 90 minutes to reach a completely cured state. The semi-cured level of the aforementioned semi-cured state may be controlled by altering the heating temperature and heating time.

Figure 2A:
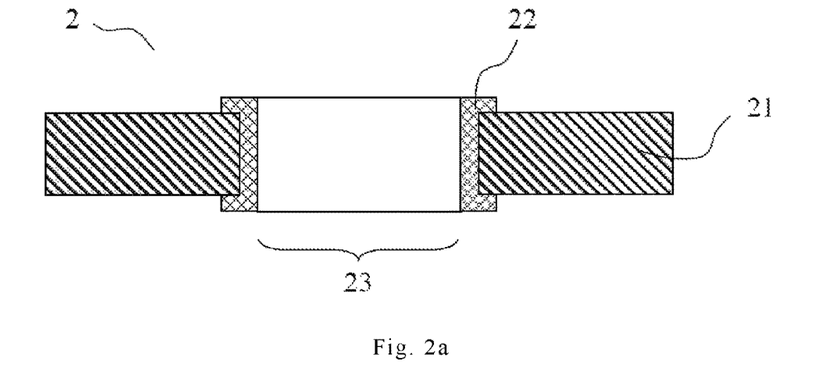
FIGS. 2a to 2c are schematic diagrams showing another embodiment of the filled printed circuit board of the present invention.
Figure 2B:
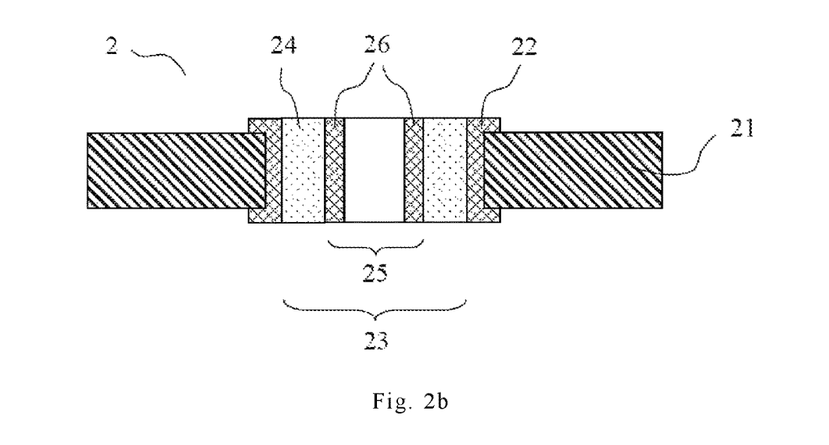
Figure 2C:
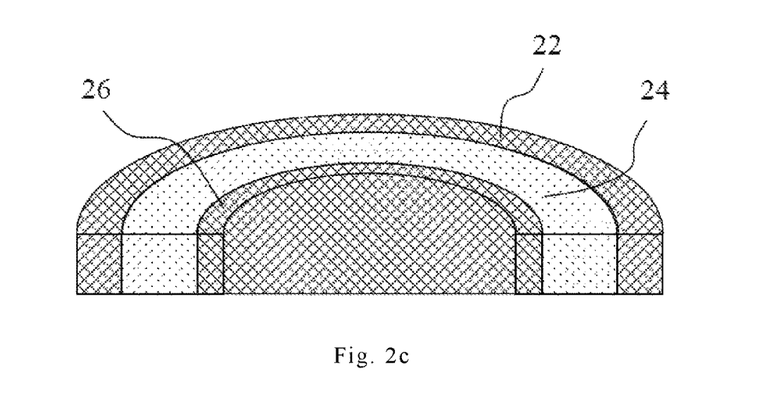

FIGS. 2a to 2c are schematic diagrams showing another embodiment of the filled printed circuit board of the present invention. As shown in FIG. 2a, a printed circuit board 2 has a dielectric layer 21, a conductive circuit layer 22, and holes 23. As shown in FIG. 2b, the resin composition 24 of the present invention can be filled into the holes 23 of the printed circuit board 2 by any conventional patterning methods, and then the filled resin composition 24 is heated and cured. Next, a hole 25 is formed in the cured resin composition 24, wherein the hole diameter of the hole 25 is smaller than that of the hole 23. Afterwards, the wall of the hole 25 is subjected to a metallization process to form a conductive circuit layer 26 with a smaller hole diameter. As shown in FIG. 2c, a structure in which the resin composition 24 is positioned between the conductive circuit layers 22 and 26 may be prepared in this way. Related manufacturing methods may also make reference to Taiwan Patent TW 525417, the subject matters of which are incorporated herein in their entirety by reference.

The present invention will be further illustrated by the embodiments hereinafter, wherein the measuring instruments and methods are respectively as follows:

[Viscosity Test]

0.2 ml of the resin composition is used as a test sample. The test sample is tested by a cone-and-plate viscometer (trade name: TV-30, manufactured by TOM SANGYO) under the following test conditions to obtain the viscosity value of the resin composition: a test temperature of 25° C., test rotation speed of 5 rpm, and test time of 30 seconds.

[Storage Stability Test]

The initial viscosity of the resin composition is measured according to the aforementioned viscosity test method upon finishing the preparation of the resin composition. Next, the resin composition is stored at 25° C. for 90 days, and after that, the viscosity of the resin composition is measured according to the aforementioned viscosity test method. The rate of viscosity variation (%) of the resin composition is calculated according to the following equation 1. The results are evaluated according to the following references. When the rate of viscosity variation is less or equal to 10%, the resin composition has good storage stability, and the storage stability test is recorded as "○". When the rate of viscosity variation is higher than 10%, the storage stability test is recorded as "X" which means the resin composition has poor storage stability.

$$\text{Rate of viscosity variation}(\%) = \frac{\text{Viscosity after storage at 25° C. for 90 days} - \text{Initial viscosity}}{\text{Initial viscosity}} \times 100\% \quad \text{[Equation 1]}$$

[Printability (Ability of Filling) Test]

Glass-fiber epoxy substrates that have plating through holes formed by panel plating are prepared. The thickness of each substrate is 1.6 mm and the diameter of each plating through hole is 0.8 mm. The resin composition is filled into the plating through holes by a screen printing method. Then, the filled glass-fiber epoxy substrates are placed in a hot-air circulating type drying furnace to be subjected to a thermal curing treatment at 130° C. and 180° C. for 30 minutes and 60 minutes, respectively, thereby, obtaining evaluation samples. The evaluation samples are physically polished and ground. The polished and ground evaluation samples are placed under a 100× optical microscope to observe cross-sections of the filled plating through holes. The results are evaluated according to the following references. When no bubbles/cracks/voids are found at any plating through holes, the printability (ability of filling) test is recorded as "○", which means the resin composition has good printability (ability of filling). When bubbles/cracks/voids are found at any one of plating through holes, the printability (ability of filling) test is recorded as "X", which means the resin composition has poor printability (ability of filling).

[Dielectric Constant (Dk) and Dissipation Factor (Df) Measurement]

The resin composition is coated onto a shiny side of copper foil by a doctor blade method. The copper foil coated with the resin composition is placed in a hot-air circulating type drying furnace to be subjected to a thermal curing treatment at 130° C. and 180° C. for 30 minutes and 60 minutes, respectively. Then, the cured resin composition is removed from the shiny side of copper foil. Dielectric constant (Dk) and dissipation factor (Df) of the cured resin composition are measured according to ASTM D150 under an operating frequency of 1 GHz.

[Solder Thermal Resistance Test]

Glass-fiber epoxy substrates that have plating through holes formed by panel plating are prepared. The thickness of each substrate is 1.6 mm and the diameter of each plating through hole is 0.8 mm. The resin composition is filled into the plating through holes by the screen printing method. Then, the filled glass-fiber epoxy substrates are placed in a hot-air circulating type drying furnace to be subjected to a thermal curing treatment at 130° C. and 180° C. for 30 minutes and 60 minutes, respectively, thereby, obtaining evaluation samples. The evaluation samples are physically polished and ground, and the polished and ground evaluation samples are immersed in a solder solution at 288° C. for 10 seconds for three times. Then, the evaluation samples are cooled down to room temperature. The evaluation samples are cut in a direction vertical to their thickness direction. Cross-sections of 100 through holes filled with the resin composition are observed by an optical microscope, and the numbers of the through holes in which the cured resin composition has cracks are recorded. The results are evaluated according to the following references. If the number of the through holes in which the cured resin composition has cracks is less than three (3), the solder thermal resistance test is recorded as "○", which means the thermal resistance of the resin composition is outstanding. If the number of through holes in which the cured resin composition has cracks ranges from three (3) to ten (10), the solder thermal resistance test is recorded as "Δ", which means the thermal resistance of the resin composition is worse. If the number of through holes in which the cured resin composition has cracks is more than ten (10), the solder thermal resistance test is recorded as "X", which means the thermal resistance of the resin composition is the worst.

EXAMPLES

Preparation of Resin Composition

Example 1

According to the ratio shown in Table 1, the benzoxazine resin of formula (I) (hereinafter "BZ resin", trade name: N6052, available from CHIN YEE CHEMICAL), epoxy resin with an alicyclic skeleton (trade name: CELLOXIDE 20219, available from DAICEL CHEMICAL INDUSTRIES), epoxy resin hardener (trade name: 2MZ-A, available from SHIKOKU CHEMICALS), BZ resin hardener (trade name: DT 310, available from HUNTSMAN CORP.), modified filler (trade name: SC-2500-SEJ, available from ADMATECHS Company), and defoaming agent (trade name: KS-66, available from SHIN-ETSU CHEMICAL CO., LRD) were mixed under room temperature to form a mixture. The mixture is then kneaded and dispersed in a three-roll mill machine to obtain resin composition 1.

Example 2

The preparation procedures of resin composition 1 were repeated to prepare resin composition 2, except that BZ resin N6052 was substituted by BZ resin of formula (I) (available from CHIN YEE CHEMICAL, trade name: N60), and the amounts of epoxy resin with an alicyclic skeleton, the epoxy resin hardener, and the BZ resin hardener were adjusted as shown in Table 1.

Example 3

The preparation procedures of resin composition 1 were repeated to prepare resin composition 3, except that the amounts of BZ resin N6052, epoxy resin with an alicyclic skeleton, the epoxy resin hardener, the BZ resin hardener, and the modified filler were adjusted as shown in Table 1.

Example 4

The preparation procedures of resin composition 1 were repeated to prepare resin composition 4, except that the epoxy resin hardener 2MZ-A was substituted by an epoxy resin hardener (available from SHIKOKU CHEMICALS, trade name: 2MA-OK) as shown in Table 1.

Example 5

The preparation procedures of resin composition 1 were repeated to prepare resin composition 5, except that BZ resin N60 was further added, and the amount of the BZ resin N6052 was adjusted as shown in Table 1.

Example 6

The preparation procedures of resin composition 1 were repeated to prepare resin composition 6, except that the amounts of the epoxy resin hardener and the BZ resin hardener were adjusted as shown in Table 1.

Example 7

The preparation procedures of resin composition 1 were repeated to prepare resin composition 7, except that the modified filler SC-2500-SEJ was substituted by a modified filler (available from ADMATECHS Company, trade name: SC-4050-SEJ) as shown in Table 1.

Example 8

The preparation procedures of resin composition 1 were repeated to prepare resin composition 8, except that the modified filler SC-4050-SEJ was further added, and the amount of the modified filler SC-2500-SEJ was adjusted as shown in Table 1.

Example 9

The preparation procedures of resin composition 1 were repeated to prepare resin composition 9, except that the modified filler SC-2500-SEJ was substituted by a modified filler (available from Denka Company, trade name: SPF-130-MHZ) as shown in Table 1.

Example 10

The preparation procedures of resin composition 7 were repeated to prepare resin composition 10, except that the modified filler SPF-130-MHZ was further added, and the amount of the modified filler SC-4050-SEJ was adjusted as shown in Table 1.

Comparative Example 1

According to the ratio shown in Table 2, an epoxy resin with an alicyclic skeleton CELLOXIDE 2021P, epoxy resins without an alicyclic skeleton (trade name: EPIKOTE 828, available from JAPAN EPDXY RESIN; and trade name: JER630, available from MITSUBISHI CHEMICAL), epoxy resin hardener 2MZ-A, modified filler SC-2500-SEJ, and defoaming agent KS-66 were mixed under room temperature to form a mixture. The mixture was kneaded and dispersed in a three-rollers grinding machine to obtain comparative resin composition 1.

Comparative Example 2

The preparation procedures of resin composition 1 were repeated to prepare comparative resin composition 2, except that the amounts of BZ resin, epoxy resin with an alicyclic skeleton, BZ resin hardener, and modified filler were adjusted so that the weight ratio of BZ resin to epoxy resin with an alicyclic skeleton is less than 10:90, as shown in Table 2.

Comparative Example 3

The preparation procedures of resin composition 1 were repeated to prepare comparative resin composition 3, except that the BZ resin hardener was not added as shown in Table 2.

Comparative Example 4

The preparation procedures of resin composition 1 were repeated to prepare comparative resin composition 4, except that the epoxy resin hardener was not added as shown in Table 2.

Comparative Example 5

The preparation procedures of resin composition 1 were repeated to prepare comparative resin composition 5, except that the epoxy resin with an alicyclic skeleton CELLOXIDE 2021P was substituted with an epoxy resin without an alicyclic skeleton JER630 as shown in Table 2.

Comparative Example 6

The preparation procedures of resin composition 1 were repeated to prepare comparative resin composition 6, except that the modified filler SC-2500-SEJ was substituted by an unmodified filler (trade name: SO-E2, available from ADMATECHS Company) as shown in Table 2.

TABLE 1

Composition of resin compositions of Examples 1 to 10

| Unit: parts by weight | | 1 | 2 | 3 | 4 | 5 | 6 | 7 | 8 | 9 | 10 |
|---|---|---|---|---|---|---|---|---|---|---|---|
| BZ resin | N6052 | 40 | 0 | 80 | 40 | 20 | 40 | 40 | 40 | 40 | 40 |
| | N60 | 0 | 60 | 0 | 0 | 20 | 0 | 0 | 0 | 0 | 0 |
| Epoxy resin with an alicyclic skeleton | CELLOXIDE 2021P | 80 | 60 | 40 | 80 | 80 | 80 | 80 | 80 | 80 | 80 |
| Epoxy resin hardener | 2MZ-A | 4 | 3 | 2 | 0 | 4 | 5 | 4 | 4 | 4 | 4 |
| | 2MA-OK | 0 | 0 | 0 | 4 | 0 | 0 | 0 | 0 | 0 | 0 |
| BZ resin hardener | DT310 | 4 | 6 | 8 | 4 | 4 | 2 | 4 | 4 | 4 | 4 |
| Modified filler | SC-2500-SEJ | 110 | 110 | 95 | 110 | 110 | 110 | 0 | 60 | 0 | 0 |
| | SC-4050-SEJ | 0 | 0 | 0 | 0 | 0 | 0 | 220 | 60 | 0 | 110 |
| | SPF-130-MHZ | 0 | 0 | 0 | 0 | 0 | 0 | 0 | 0 | 110 | 50 |

TABLE 1-continued

Composition of resin compositions of Examples 1 to 10

| Unit: parts by weight | | Examples |  |  |  |  |  |  |  |  |  |
|---|---|---|---|---|---|---|---|---|---|---|---|
| | | 1 | 2 | 3 | 4 | 5 | 6 | 7 | 8 | 9 | 10 |
| Unmodified filler | SO-E2 | 0 | 0 | 0 | 0 | 0 | 0 | 0 | 0 | 0 | 0 |
| Defoaming agent | KS-66 | 1 | 1 | 1 | 1 | 1 | 1 | 1 | 1 | 1 | 1 |

TABLE 2

Composition of resin compositions of Comparative Examples 1 to 6

| Unit: parts by weight | | Comparative Examples |  |  |  |  |  |
|---|---|---|---|---|---|---|---|
| | | 1 | 2 | 3 | 4 | 5 | 6 |
| BZ resin | N6052 | 0 | 10 | 40 | 40 | 40 | 40 |
| | N60 | 0 | 0 | 0 | 0 | 0 | 0 |
| Epoxy resin with an alicyclic skeleton | CELLOXIDE 2021P | 25 | 110 | 80 | 80 | 0 | 80 |
| Epoxy resin without an alicyclic skeleton | EPIKOTE 828 | 50 | 0 | 0 | 0 | 0 | 0 |
| | JER630 | 25 | 0 | 0 | 0 | 80 | 0 |
| Epoxy resin hardener | 2MZ-A | 7 | 5 | 4 | 0 | 4 | 4 |
| | 2MA-OK | 0 | 0 | 0 | 0 | 0 | 0 |
| BZ resin hardener | DT310 | 0 | 1 | 0 | 4 | 4 | 4 |

TABLE 2-continued

Composition of resin compositions of Comparative Examples 1 to 6

| Unit: parts by weight | | Comparative Examples |  |  |  |  |  |
|---|---|---|---|---|---|---|---|
| | | 1 | 2 | 3 | 4 | 5 | 6 |
| Modified filler | SC-2500-SEJ | 120 | 200 | 110 | 110 | 110 | 0 |
| | SC-4050-SEJ | 0 | 0 | 0 | 0 | 0 | 0 |
| | SPF-130-MHZ | 0 | 0 | 0 | 0 | 0 | 0 |
| Unmodified filler | SO-E2 | 0 | 0 | 0 | 0 | 0 | 110 |
| Defoaming agent | KS-66 | 1 | 1 | 1 | 1 | 1 | 1 |

[Test of Resin Composition]

The viscosity test, storage stability test, printability (ability of filling) test, and solder thermal resistance test were conducted for resin compositions 1 to 10 and comparative resin compositions 1 to 6. The dielectric constant (Dk) and dissipation factor (Df) of resin compositions 1 to 10 and comparative resin compositions 1 to 6 were measured. The results are tabulated in Table 3.

TABLE 3

Test results of resin compositions

| | | Viscosity (dPa·s) | Storage stability | Printability (ability of filling) | Dk @ 1 GHz | Df @ 1 GHz | Solder thermal resistance |
|---|---|---|---|---|---|---|---|
| Examples | 1 | 418 | ○ | ○ | 2.95 | 0.013 | ○ |
| | 2 | 520 | ○ | ○ | 2.92 | 0.012 | ○ |
| | 3 | 567 | ○ | ○ | 2.84 | 0.014 | ○ |
| | 4 | 401 | ○ | ○ | 3.08 | 0.011 | ○ |
| | 5 | 453 | ○ | ○ | 2.96 | 0.010 | ○ |
| | 6 | 380 | ○ | ○ | 3.09 | 0.015 | ○ |
| | 7 | 612 | ○ | ○ | 3.02 | 0.016 | ○ |
| | 8 | 371 | ○ | ○ | 3.06 | 0.013 | ○ |
| | 9 | 442 | ○ | ○ | 3.10 | 0.016 | ○ |
| | 10 | 559 | ○ | ○ | 2.99 | 0.013 | ○ |
| Comparative Examples | 1 | 521 | ○ | ○ | 3.72 | 0.029 | ○ |
| | 2 | 350 | ○ | X | 3.22 | 0.018 | X |
| | 3 | 392 | ○ | ○ | 3.58 | 0.020 | Δ |
| | 4 | 416 | ○ | Not applicable | Not applicable | Not applicable | Not applicable |
| | 5 | 561 | ○ | Not applicable | Not applicable | Not applicable | Not applicable |
| | 6 | 583 | ○ | X | 3.12 | 0.019 | X |

As shown in Table 3, the solvent-free resin compositions of the present invention are provided with satisfactory viscosity, storage stability, printability (ability of filling), and solder thermal resistance. In particular, the solvent-free resin composition of the present invention has lower Dk (Dk @ 1 GHz≤3.10) and Df (Df @ 1 GHz≤0.016). When the resin composition does not comprise BZ resin of formula (1) (i.e., Comparative Example 1), the desired low Dk (Dk @ 1 GHz goes up to 3.72) and low Df (Df @ 1 GHz goes up to 0.029) are unavailable. When the weight ratio of the BZ resin to epoxy resin with an alicyclic skeleton is less than 10:90 (i.e., Comparative Example 2, in which the amount of BZ resin is too low), the solder thermal resistance and printability (ability of filling) of the resin composition deteriorate. When the resin composition does not comprise the BZ resin hardener (i.e., Comparative Example 3), the desired low Dk (Dk @ 1 GHz goes up to 3.58) are unavailable. When the resin composition does not comprise the epoxy resin hardener (i.e., Comparative Example 4), the resin composition cannot be cured. When the resin composition uses an epoxy resin without an alicyclic skeleton rather than an epoxy resin with an alicyclic skeleton (i.e., Comparative Example 5), the compatibility of the resin composition becomes poor, thereby, leading to severe delamination. As a result, the resin composition cannot be printed into a sample for electrical property measurements. When the resin composition uses an unmodified filler rather than a modified filler (i.e., Comparative Example 6), the solder thermal resistance and printability (ability of filling) of the resin composition deteriorate, thereby, leading to cracks.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF REFERENCE NUMERALS

1, 2: printed circuit board
11, 21: dielectric layer
12, 22, 26: conductive circuit layer
13, 23, 25: holes
14, 24: resin composition

What is claimed is:
1. A solvent-free resin composition, comprising:
(A) a benzoxazine resin of formula (I), formula (I)

-continued (B) an epoxy resin with an alicyclic skeleton;
(C) an epoxy resin hardener;
(D) a benzoxazine resin hardener; and
(E) a modified filler,
wherein in formula (I),
A is a $C_{24}$-$C_{48}$ divalent hydrocarbon group with one or more aliphatic side chains;
B is a covalent bond, or a $C_1$-$C_{13}$ divalent hydrocarbon group;
R is H or a $C_1$-$C_{15}$ alkyl; and
n is an integer of 0 to 100.

2. The resin composition of claim 1, wherein n is an integer of 0 to 50.

3. The resin composition of claim 2, wherein the weight ratio of the benzoxazine resin (A) to the epoxy resin (B) with an alicyclic skeleton is about 1:9 to about 9:1.

4. The resin composition of claim 3, wherein the weight ratio of the benzoxazine resin (A) to the epoxy resin (B) with an alicyclic skeleton is about 3:7 to about 7:3.

5. The resin composition of claim 1, wherein the epoxy resin (B) with an alicyclic skeleton does not contain a glycidyl ether group.

6. The resin composition of claim 5, wherein the weight ratio of the benzoxazine resin (A) to the epoxy resin (B) with an alicyclic skeleton is about 1:9 to about 9:1.

7. The resin composition of claim 6, wherein the weight ratio of the benzoxazine resin (A) to the epoxy resin (B) with an alicyclic skeleton is about 3:7 to about 7:3.

8. The resin composition of claim 1, wherein the epoxy resin (B) with an alicyclic skeleton has an ester group or an ether group as a connecting group.

9. The resin composition of claim 1, wherein the epoxy resin hardener (C) is selected from the group consisting of imidazole, imidazole derivatives, salts of imidazole, salts of imidazole derivatives, and combinations thereof.

10. The resin composition of claim 1, wherein the benzoxazine resin hardener (D) is selected from the group consisting of thiodipropionic acid, phenols, thiodiphenol benzoxazine, sulfonyl benzoxazine, sulfonyldiphenol, and combinations thereof.

11. The resin composition of claim 1, wherein the modified filler (E) is selected from the group consisting of modified silica, modified barium sulfate, modified calcium carbonate, modified silicon nitride, modified aluminum nitride, modified boron nitride, modified aluminum oxide, modified magnesium oxide, modified aluminum hydroxide, modified magnesium hydroxide, modified titanium oxide, modified mica, modified talc, modified organic bentonite, modified kaolin, modified Sillitin, modified silicon, and combinations thereof.

12. The resin composition of claim 11, wherein the modified filler (E) is modified silica.

13. The resin composition of claim 1, wherein the weight ratio of the benzoxazine resin (A) to the epoxy resin (B) with an alicyclic skeleton is about 1:9 to about 9:1.

14. The resin composition of claim 13, wherein the weight ratio of the benzoxazine resin (A) to the epoxy resin (B) with an alicyclic skeleton is about 3:7 to about 7:3.

15. The resin composition of claim 1, wherein the amount of the epoxy resin hardener (C) is about 0.1 parts by weight to about 20 parts by weight per 100 parts by weight of the epoxy resin (B) with an alicyclic skeleton.

16. The resin composition of claim 1, wherein the amount of the benzoxazine resin hardener (D) is about 0.1 parts by weight to about 20 parts by weight per 100 parts by weight of the benzoxazine resin (A).

17. The resin composition of claim 1, wherein the amount of the modified filler (E) is about 35 wt % to about 80 wt % based on the total weight of the resin composition.

18. The resin composition of claim 1, further comprising an additive selected from the group consisting of flame retardants, colorants, viscosity modifiers, thixotropic agents, defoaming agents, leveling agents, coupling agents, mold-release agents, surface treating agents, plasticizers, antibacterial agents, antimould agents, stabilizers, antioxidants, phosphors, and combinations thereof.

19. The resin composition of claim 18, wherein the flame retardant is selected from the group consisting of phosphorous-containing flame retardants, bromine-containing flame retardants, and combinations thereof.

20. A printed circuit board, which has holes filled by using the resin composition of claim 1.

* * * * *